(12) United States Patent
Komatsu

(10) Patent No.: US 7,253,033 B2
(45) Date of Patent: Aug. 7, 2007

(54) METHOD OF MANUFACTURING A SEMICONDUCTOR DEVICE THAT INCLUDES IMPLANTING IN MULTIPLE DIRECTIONS A HIGH CONCENTRATION REGION

(75) Inventor: Hiroshi Komatsu, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/832,562

(22) Filed: Apr. 26, 2004

(65) Prior Publication Data

US 2004/0197970 A1  Oct. 7, 2004

Related U.S. Application Data

(62) Division of application No. 10/240,472, filed on Oct. 2, 2002.

(30) Foreign Application Priority Data

| Feb. 7, 2001 | (JP) | ............................ P2001-030441 |
| Aug. 28, 2001 | (JP) | ............................ P2001-257203 |
| Feb. 7, 2002 | (WO) | ........................ PCT/JP02/00977 |

(51) Int. Cl.
    *H01L 21/00*  (2006.01)
(52) U.S. Cl. ................ 438/149; 438/163; 257/E21.561
(58) Field of Classification Search .................. 438/45, 438/149, 151, 163, 164, 194, 197, 217, 229–231, 438/257, 289, 299–303, 311, 479, 510, 514, 438/525; 257/E21.561
    See application file for complete search history.

(56) References Cited

U.S. PATENT DOCUMENTS

| 5,120,666 | A | * | 6/1992 | Gotou | ......................... 438/164 |
| 5,166,084 | A | * | 11/1992 | Pfiester | ........................ 438/151 |
| 5,185,280 | A | * | 2/1993 | Houston et al. | ............ 438/163 |
| 5,273,921 | A | * | 12/1993 | Neudeck et al. | ............ 438/157 |
| 5,349,228 | A | * | 9/1994 | Neudeck et al. | ............ 257/365 |
| 5,773,331 | A | * | 6/1998 | Solomon et al. | ............ 438/164 |
| 5,818,070 | A | * | 10/1998 | Yamazaki et al. | ............ 257/72 |
| 5,834,797 | A | * | 11/1998 | Yamanaka | .................... 257/57 |
| 5,923,987 | A | * | 7/1999 | Burr | ........................... 438/304 |
| 5,929,479 | A | * | 7/1999 | Oyama | ....................... 257/315 |
| 5,936,278 | A | * | 8/1999 | Hu et al. | ..................... 257/336 |
| 6,043,535 | A | * | 3/2000 | Houston | ..................... 257/345 |
| 6,207,530 | B1 | * | 3/2001 | Hsu et al. | .................. 438/404 |
| 6,342,717 | B1 | * | 1/2002 | Komatsu | ..................... 257/347 |

(Continued)

FOREIGN PATENT DOCUMENTS

JP          05-21800        1/1993

(Continued)

*Primary Examiner*—Michael Lebentritt
*Assistant Examiner*—Stanetta Isaac
(74) *Attorney, Agent, or Firm*—Sonnenschein Nath & Rosenthal LLP

(57) ABSTRACT

In a complete depletion type SOI transistor, the roll-off of a threshold value is suppressed, independently from the formation of an SOI film to be thinner. As for a semiconductor device (1), the impurity concentration in a channel formation portion (10) is implanted not uniformly along the length direction of a gate (2) in the complete depletion type silicon on insulation (SOI) transistor. In other words, high concentration regions (11) where impurity concentrations are higher than that at a central portion in the end parts of the channel formation portion (10) on the side of a source (4) and a drain (5).

4 Claims, 14 Drawing Sheets

U.S. PATENT DOCUMENTS

| | | | |
|---|---|---|---|
| 6,432,754 B1* | 8/2002 | Assaderaghi et al. | 438/149 |
| 6,432,763 B1* | 8/2002 | Yu | 438/217 |
| 6,433,609 B1* | 8/2002 | Voldman | 327/313 |
| 6,521,949 B2* | 2/2003 | Assaderaghi et al. | 257/347 |
| 6,541,345 B1* | 4/2003 | Komatsu | 438/311 |
| 6,541,821 B1* | 4/2003 | Krishnan et al. | 257/347 |
| 6,645,795 B2* | 11/2003 | Muller et al. | 438/149 |
| 6,664,598 B1* | 12/2003 | Dennard et al. | 257/347 |
| 6,686,637 B1* | 2/2004 | Dokumaci et al. | 257/412 |
| 6,759,282 B2* | 7/2004 | Campbell et al. | 438/149 |
| 6,762,101 B2* | 7/2004 | Chan et al. | 438/283 |
| 6,812,527 B2* | 11/2004 | Dennard et al. | 257/347 |
| 6,815,296 B2* | 11/2004 | Dennard et al. | 438/283 |
| 6,833,569 B2* | 12/2004 | Dokumaci et al. | 257/250 |
| 6,982,460 B1* | 1/2006 | Cohen et al. | 257/331 |
| 7,018,873 B2* | 3/2006 | Dennard et al. | 438/149 |
| 2005/0037582 A1* | 2/2005 | Dennard et al. | 438/281 |
| 2005/0048703 A1* | 3/2005 | Dennard et al. | 438/149 |
| 2005/0181552 A1* | 8/2005 | Koyama | 438/163 |

FOREIGN PATENT DOCUMENTS

| | | |
|---|---|---|
| JP | 06-268215 | 9/1994 |
| JP | 11-214686 | 8/1999 |

* cited by examiner

AFTER HEAT TREATMENT

AFTER IMPURITY INJECTION

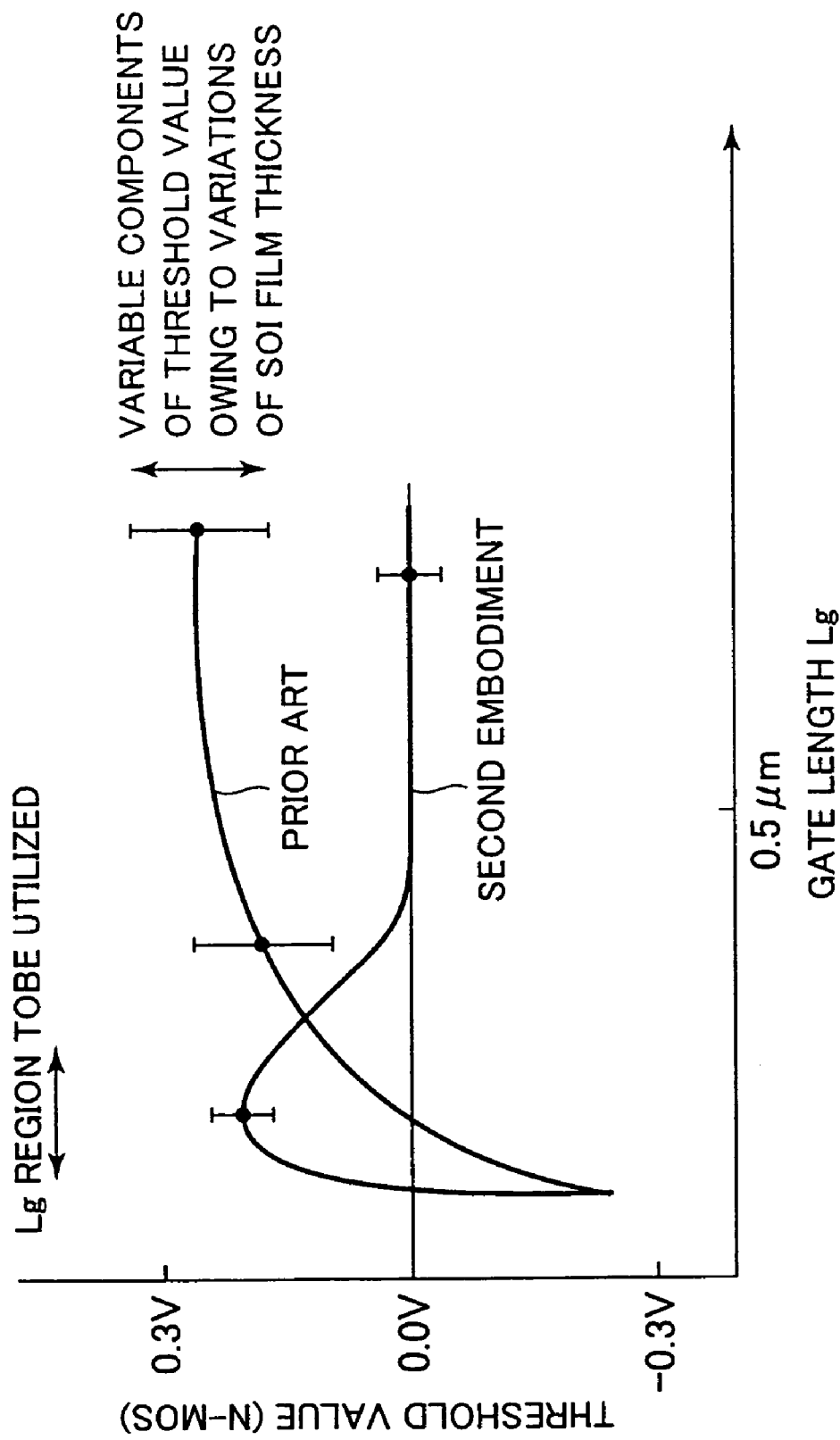

METHOD OF MANUFACTURING A SEMICONDUCTOR DEVICE THAT INCLUDES IMPLANTING IN MULTIPLE DIRECTIONS A HIGH CONCENTRATION REGION

RELATED APPLICATION DATA

The present application is a divisional of U.S. application Ser. No. 10/240,472 filed Oct. 2, 2002 (incorporated herein by reference to the extent permitted by law), and claims priority to PCT application No. PCT/JP02/00977 filed Feb. 7, 2002, and Japanese Application(s) No(s). P2001-030441 filed Feb. 7, 2001, and P2001-257203 filed Aug. 28, 2001.

TECHNICAL FIELD

The present invention relates to a semiconductor device composed of a complete depletion type SOI transistor and a method of manufacturing thereof.

BACKGROUND OF THE INVENTION

In recent years, the development of a transistor having a silicon on insulator (SOI) structure (or an SOI transistor) has been performed energetically from the point of view of its low electrical power consumption, its capability of being driven in a high speed, and the like. It is known that the complete isolation of elements of the SOI transistors from each other becomes easy owing to their SOI structures, and that it becomes possible to suppress software errors and latch-up peculiar to a CMOS transistor. Accordingly, since comparatively early times, considerations have been made on making the speed and the reliability of a CMOS transistor LSI higher by means of an SOI structure having an Si active layer being about 500 nm.

If an SOI transistor is in the condition in which almost all of its Si active layer is depleted (or a complete depletion type SOI transistor) by the control of the surface Si layer of its SOI to be further thinner to be approximately 100 nm or less, and by controlling of the impurity concentration of its channel to be comparatively low, the SOI transistor may have further optimized characteristics such as the steep rising of a drain current in a subthreshold region and the like as well as the decrease of the capacities of its diffusion layers. Consequently, people have recently begun to expect the application of the complete depletion type SOI transistor in low electrical power consumption LSI regarded as a requirement for upcoming portable equipment and the like.

However, it has become necessary for the complete depletion type SOI transistor to have a thinner SOI film according to the reduction according to design rule (a single gate type SOI is generally required to have the thickness of a channel SOI film of a tenth of a finished gate length or less). Consequently, the following problems have become conspicuous.

In other words, as for the thickness of an SOI film required for next generation fine LSI's, a further thinner SOI layer is required for keeping the reduction of the gate length of the complete depletion type SOI transistor if it is attempted at suppressing a short channel effect only by the formation of the thickness of the SOI film to be thinner in the complete deletion type SOI.

For example, Hon-Sum Philip Wong, et al. reported calculation results by means of a device simulator in 1998 IEEE, IEDM 98, pp. 407-410. According to the report, the roll-off of Vth cannot sufficiently be suppressed unless the thickness of the SOI film is 10 nm or less in case of a 0.1 µm generation transistor. However, the thickness is only a simulation result. If it is tried to make a device having such a thin thickness of a SOI film actually, the following problems occur on its process.

(1) Increase of Parasitic Resistance
(2) Deterioration of Controllability of Threshold Voltage (Vth)
(3) Problem of Contact Formation on Diffusion Layer
(4) Problem of decrease of mobility of carriers (quantum effect)
(5) Deterioration of crystallinity (or generation of aggregation of Si)

In other words, when an SOI layer becomes turns to an extremely thin film, even if silicides are formed, parasitic resistances cannot be decreased at a large extent even though the thickness of a metal film is made to be thick because a Si layer has a finite film thickness. Furthermore, if the thickness of an SOI film or a silicide film in a diffusion layer becomes extremely thin, it becomes very difficult to stop etching at the diffusion layer at the time of the working of an interlayer dielectric for forming a first contact.

In addition, if it is attempted at suppressing the short channel effect only by the formation of the SOI layer to be thinner, it becomes necessary to add, for example, selective epitaxial growth, the control of the work function of a gate electrode, and the like. On the other hand, the problems of the decrease of the mobility of carries owing to a quantum effect, the aggregation of Si, and the like are essential problems inherent to the material, and therefore their solution is very difficult.

In addition, if it is attempted at controlling the threshold value of a complete depletion type SOI transistor by means of the concentration of an impurity to be introduced into a channel, the threshold value is determined by the total amount of the introduced impurity. Consequently, because the total amount of the impurity changes in dependence of the thickness of the SOI film, the dispersion of the threshold value owing to the changes of the thickness of the SOI film becomes large.

SUMMARY OF THE INVENTION

The present invention was been made for solving such problems. In other words, as for a semiconductor device of the present invention, impurity concentrations in a channel formation portion are implanted not uniformly along a gate length direction in a complete depletion type silicon on insulator (SOI) transistor.

In addition, a method of manufacturing of a semiconductor device according to the present invention includes a process of forming a gate oxide in an element formation region of an SOI layer and forming a gate through the gate oxide, a process of forming a high concentration region, in which an impurity concentration is higher than that of a central portion of a channel formation portion, at an end part of the channel formation portion corresponding to the gate in the element formation region and a process of forming a source and a drain by implanting an impurity into part in the element formation region other than the channel formation region to constitute a complete depletion type SOI transistor structure.

In such a present invention, because the impurity concentration in the channel formation portion is implanted not uniformly along the gate length direction in the complete depletion type SOI transistor, the threshold value of a long channel transistor is determined by a low impurity concentration at which almost all of the channel formation portion is occupied, and the threshold value of a short channel transistor is determined by the impurity concentration at a high concentration region of the channel formation portion.

In particular, by making the region having relatively high impurity concentration formed in a fixed width on the region independent of the channel length of the transistor, it becomes possible to suppress changes of threshold value as the channel length changes (the shorter the channel length, the smaller the threshold value).

BRIEF DESCRIPTION OF DRAWINGS

FIG. 8 is a diagram illustrating the dependence of threshold values on gate lengths;

DETAILED DESCRIPTION OF THE PREFERRED EMBODIMENTS

Figure 1:
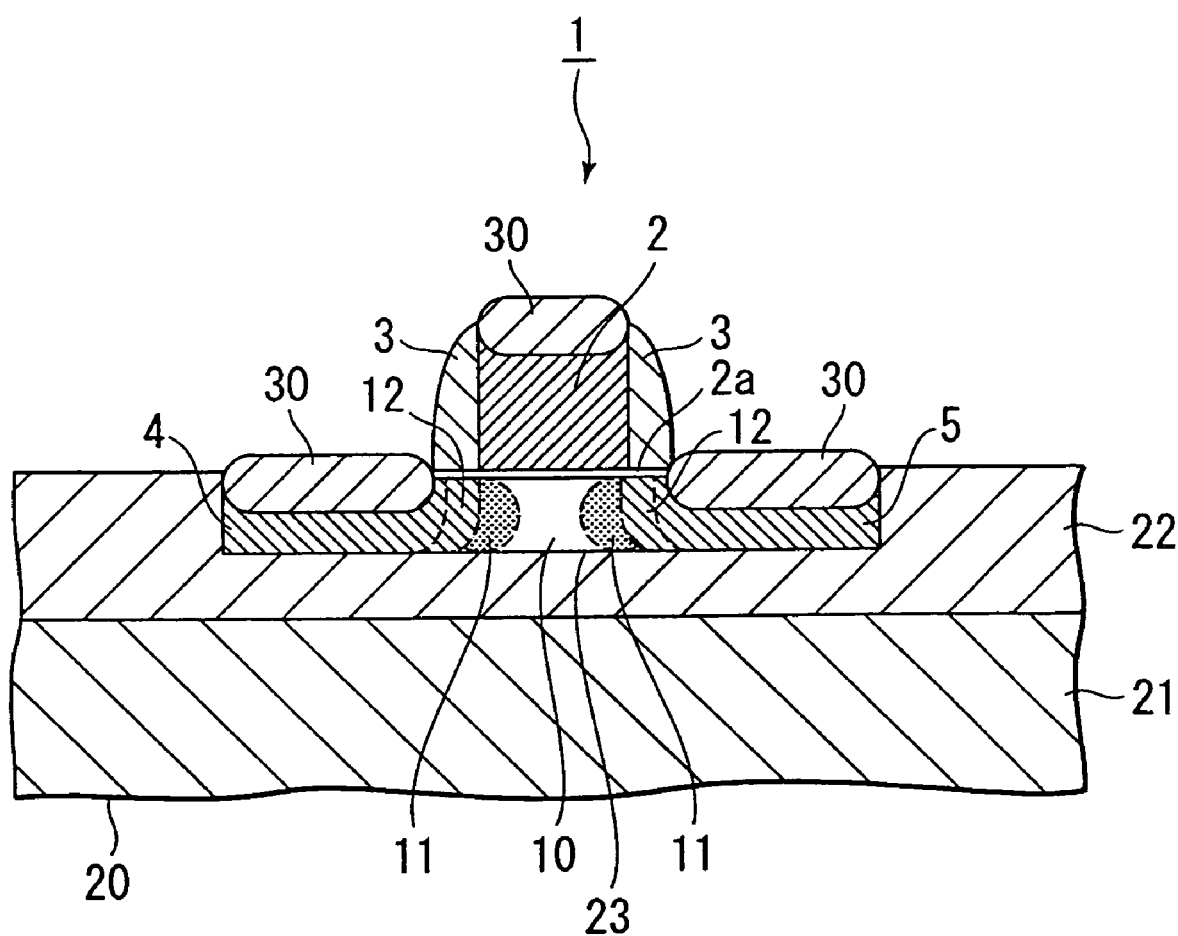
FIG. 1 is a schematic section diagram illustrating a semiconductor device according to a first embodiment.

Hereinafter, embodiments of the present invention are described on the basis of the attached drawings. FIG. 1 is a schematic section diagram illustrating a semiconductor device according to a first embodiment. The semiconductor device 1 is composed of a complete depletion type SOI transistor formed on an SOI layer 23 formed on an SIMOX substrate 20 (or a low dose SIMOX).

In the SOI film 23, there are a channel formation portion 10 formed at the central portion thereof, a source 4 and a drain 5 formed on both the end parts thereof. In addition, a gate 2 is formed above the channel formation portion 10 with an insulation film 2a put between them.

Side walls 3 are formed on both the sides of the gate 2 and extension regions 12 are formed in the SOI film located below the side walls 3.

In such a complete depletion type SOI transistor, the present embodiment is characterized in that impurity concentrations in the channel formation portion 10 are implanted not uniformly along the length direction of the gate 2 (in the direction connecting the source 4 and the drain 5).

Specifically, high concentration regions 11, in which impurity concentrations are higher than that at the central portion of the channel formation portion 10, are formed in the vicinity of the extension regions 12 in the channel formation portion 10. It is to be noted that, in case of a transistor in which the extension regions 12 are not formed, the high concentration regions 11 are formed in the vicinity of the source 4 and the drain 5 in the channel formation portion 10.

Now, if the semiconductor device 1 is an N-MOS transistor, the semiconductor device 1 is formed on, for example, an SIMOX substrate 20 composed of a p-type support substrate 21 having a specific resistance of 20 Ω cm or less and an embedded oxide film 22, the thickness of which is, for example, 100 nm.

The SOI film 23 (or the channel formation portion 10) directly under the gate 2 has, for example, a thickness of 26 nm. Silicides 30 are formed self conformably in the source 4, the drain 5 and the gate 2, all being diffusion layers, by means of, for example, Co of 5 nm in deposited thickness (the thickness of $CoSi_2$ is 18 nm or less).

The insulation film 2a between the gate 2 and the channel formation portion 10 has a thickness of about 3.5 nm. The gate 2 is composed of $n^+$ poly Si (thickness of 200 nm) in which Phos is sufficiently doped.

In all of the source 4, the drain 5 and the extension regions 12, As is doped in high concentrations, and the SOI film 23 including the extension regions 12 is made to have a sufficiently low resistance. The side walls 3 formed on the side walls of the gate 2 are made of $SiO_2$, and their widths are about 100 nm or less.

The impurity concentration in the vicinity of the center of the channel formation portion 10 is $2\times10^{18}$ cm$^{-3}$ or less (B is $6\times10^{12}$ cm$^{-2}$ by dose). However, the impurity concentrations of the high concentration regions 11 in the channel formation portion 10 are $3\times10^{19}$ cm$^{-3}$ or less at their peak concentrations (B is $1\times10^{14}$ cm$^{-2}$ or less by dose). The high concentration regions 11 in the channel formation portion 10 are sized to be, for example, 50 nm or less in their lateral directions (in the gate length direction) uniformly even if the length of the gate 2 changes.

By making the semiconductor device 1 be formed in such a structure, the threshold value Vth of an N-MOS transistor becomes 0.4 V or less in case of a long channel transistor having a gate length of 6.0 μm or less. On the other hand, even in case of a short channel transistor having a gate length of 0.14 μm or less, the threshold voltage Vth thereof lowers only up to about 0.3 V or less, and consequently it becomes possible to suppress the roll-off thereof at about 0.1 V or less.

Figure 2A:
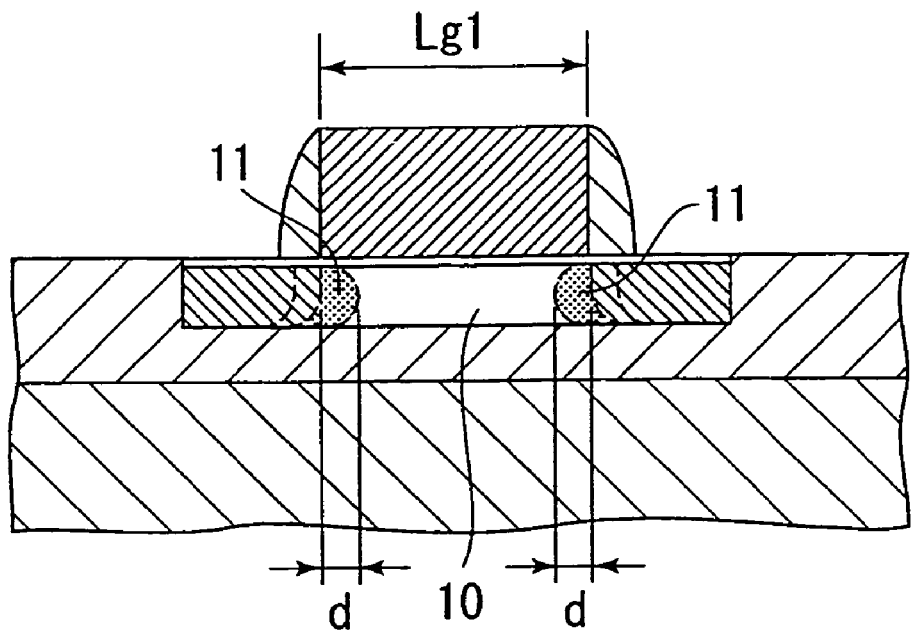
FIG. 2A and FIG. 2B are schematic section diagrams illustrating the structures of semiconductor devices having different channel lengths from each other.
Figure 2B:
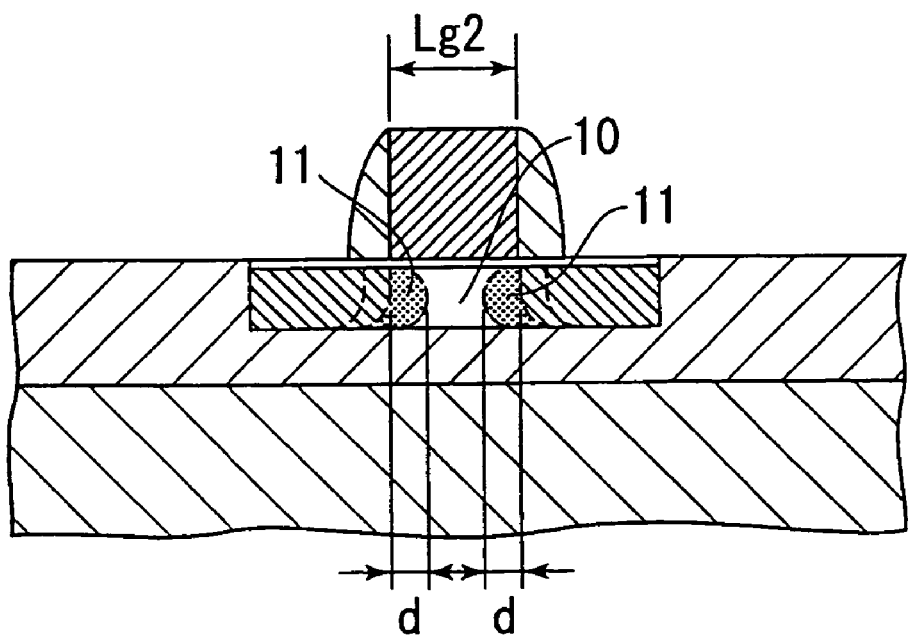

FIG. 2A and FIG. 2B are schematic section diagrams illustrating the structures of semiconductor devices having different channel lengths from each other. In the present embodiment, widths d of the high concentration regions 11 formed in the channel formation portions 10 are made to be constant independently from gate lengths between a transistor having a long channel formation portion 10 of a gate length Lg1 shown in FIG. 2A (or a long channel transistor) and a transistor having a short channel formation portion 10 of a gate length Lg2 shown in FIG. 2B (or a short channel transistor).

As a result, it becomes possible to suppress the changes of the threshold values of transistors in accordance with the changes of their channel lengths (the shorter the channel lengths are, the smaller the threshold values). The reason is that, because the contributions of the high impurity concentrations become relatively larger in a shorter channel transistor, the effective impurity concentration of the channel formation portion 10 of the shorter channel transistor becomes higher.

Figure 3:
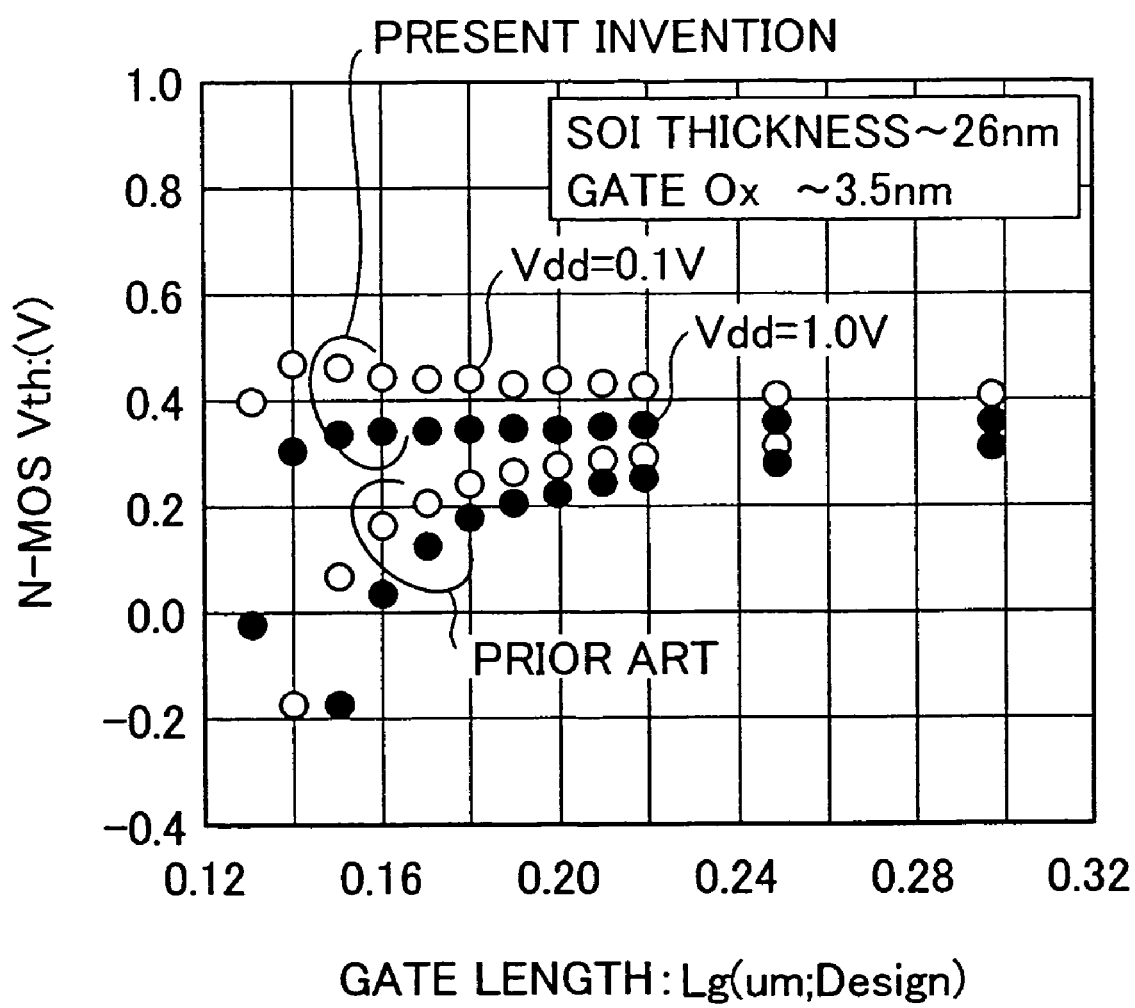
FIG. 3 is a diagram illustrating changes of threshold values to gate lengths (or channel lengths)

FIG. 3 is a diagram illustrating changes of threshold values to gate lengths (or channel lengths). The figure shows the changes of the threshold voltages of N-MOS transistors without any high concentration regions in their channel formation portions according to the prior art and the changes of the threshold voltages of N-MOS transistors with high concentration regions in their channel formation portions according to the present invention.

On the longer channel side, the present invention and the prior art have almost the same threshold values Vth, but on the shorter channel side, the threshold values Vth according to the prior art show large roll-offs, and the threshold values Vth of the present invention show small roll-offs.

Consequently, it becomes possible for the present embodiment to suppress the decrease of a threshold voltage without making the thickness of a channel formation portion (SOI film) to be thin even in the case where a gate length (or a channel length) is made short. In particular, in the semiconductor device 1 of the present embodiment, it becomes possible to form the thickness of the SOI film to be thicker than a tenth of the gate length and to be thinner than a half thereof.

Figure 4A:
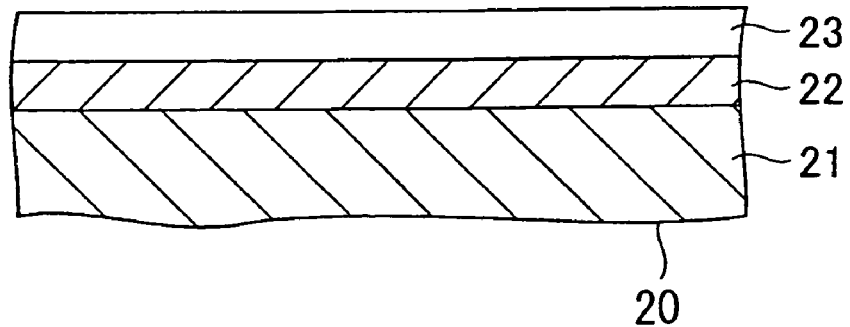
FIGS. 4A to 4C are schematic section diagrams (a first type) illustrating a method of manufacturing of a semiconductor device in order.

Next, a method of manufacturing of the semiconductor device according to the present embodiment is described. FIGS. 4A-4C and 5A-5C are schematic section diagrams illustrating a method of manufacturing of the semiconductor device according to the present embodiment in order. At first, as shown in FIG. 4A, a SIMOX substrate 20 composed of a p-type support substrate 21 having a specific resistance of 20 Ω cm or less, an embedded oxide film 22 of, for example, 100 nm in thickness, and an SOI film 23 of 42 nm or less in thickness is prepared. And element isolation is performed by a well-known method (for example, Trench Method).

Figure 4B:
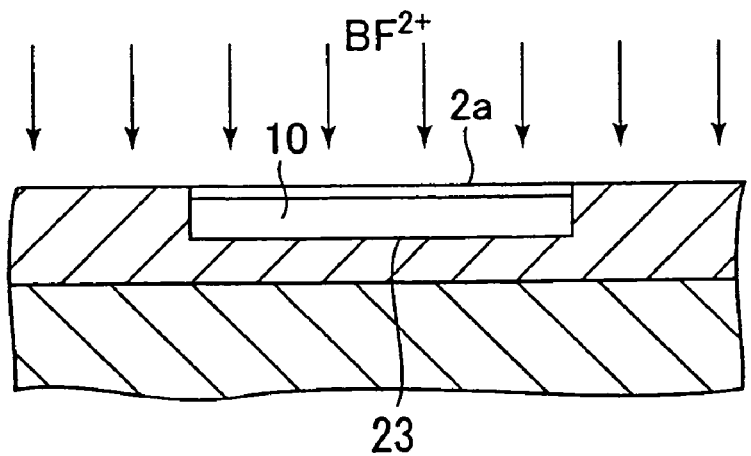

Next, as shown in FIG. 4B, impurity ions are implanted into part of the SOI film 23 to be a channel formation portion 10. The conditions of the ion implantation are, for example, as follows.

Ionic Species: $BF_2^+$
Acceleration Voltage: 15 keV
Dose Amount: $6 \times 10^{12}$ cm$^{-2}$
Implantation Angle: 0°

Figure 4C:
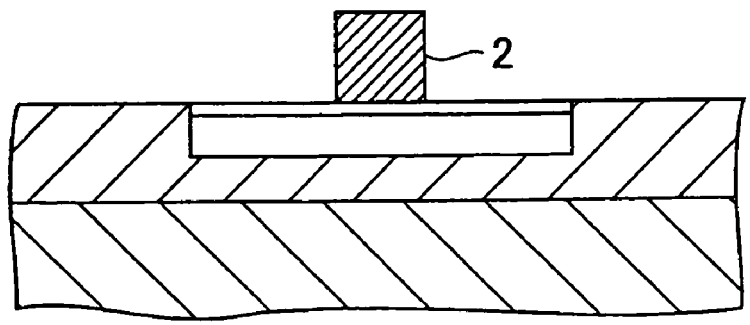

As a result of such ion implantation, the channel formation section 10 is in a status in which the impurity is uniformly doped in the gate length direction. After that, an insulation film 2a having the thickness of about 3.5 nm is formed on the SOI film 23 and poly Si to become a gate 2 shown in FIG. 4C is deposited thereon. Then, an impurity (Phos) is introduced into the poly Si, and then the patterning thereof is performed to form the gate 2.

Figure 5A:
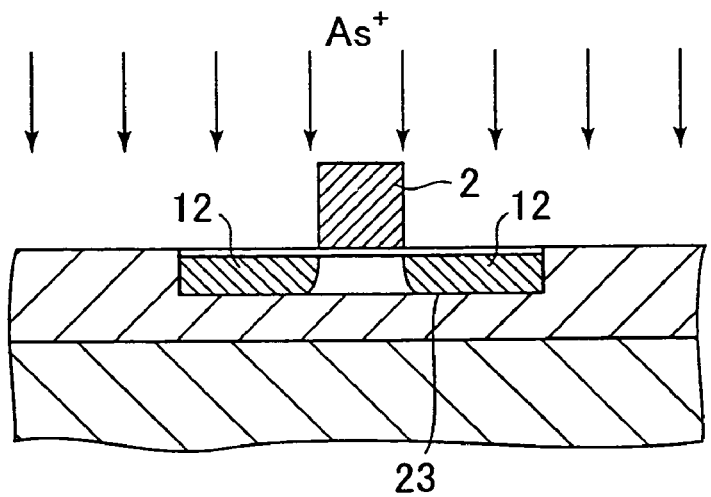
FIGS. 5A to 5C are schematic section diagrams (a second type) illustrating the method of manufacturing of the semiconductor device in order.

Next, as shown in FIG. 5A, impurity is implanted into the SOI film 23 for forming extension regions 12 which are self conformable in relation to the gate 2. For example, the conditions of the ion implantation at this time are as follows.

Ionic Species: $As^+$
Acceleration Voltage: 2.5 keV
Dose Amount: $2.4 \times 10^{15}$ cm$^{-2}$
Implantation Angle: 0°

Figure 5B:
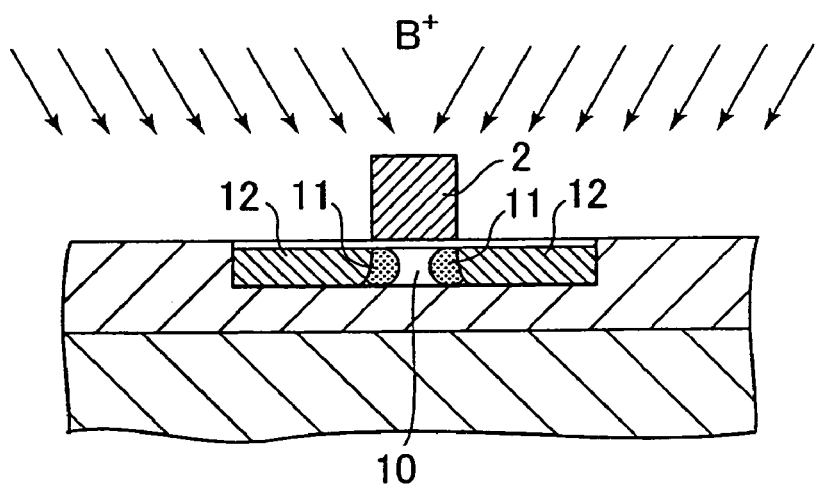

Next, as shown in FIG. 5B, oblique ion implantation (Halo Ion Implantation or Pocket Ion Implantation) is performed under the following conditions for forming high concentration regions 11, in which channel impurity concentrations are relatively higher than that at the central portion, on both the end parts of the channel formation portion 10 adjoining the extension regions 12.

Ionic Species: $B^+$
Acceleration Voltage: 8.0 keV
Dose Amount: $1.28 \times 10^{14}$ cm$^{-2}$ (divisional implantation from eight directions of $1.6 \times 10^{12} \times 8$ per direction)
Implantation Angle: 20°

By performing the oblique implantation self conformable in relation to the gate 2 in such way, it becomes possible to form the high concentration regions 11, in which the impurity concentrations are relatively higher than that at the center, in both the end parts of the channel formation portion 10 adjoining the extension regions 12 in constant widths independent of the gate length.

Figure 5C:
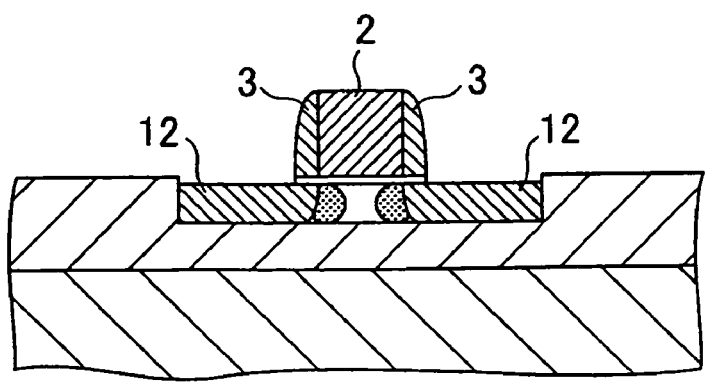
Figure 6A:
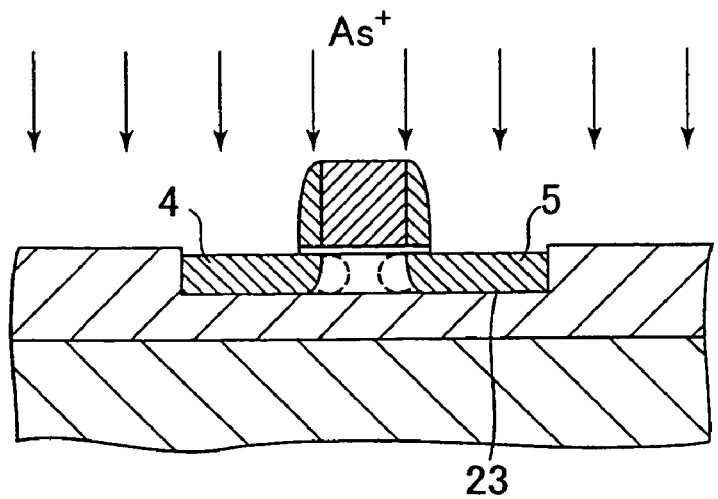
FIGS. 6A to 6C are schematic section diagrams (a third type) illustrating the method of manufacturing of the semiconductor device in order.

Next, as shown in FIG. 5C, side walls 3 are formed on both the side walls of the gate 2 by the all surface deposition of $SiO_2$ and etch back. Next, as shown in FIG. 6A, after an impurity (for example, As) is implanted into portions to be a source 4 and a drain 5 of the SOI film 23 to high concentrations, a heat treatment for the activation of the impurity is performed under, for example, the following conditions.

950° C., 10 sec., $N_2$ atmosphere, RTA processing.

Figure 6B:
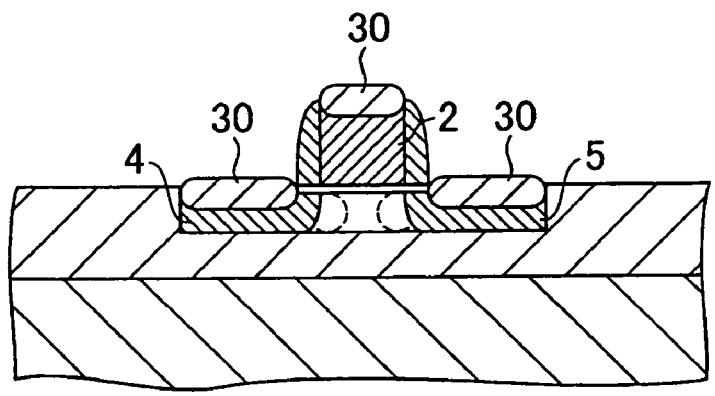
Figure 6C:
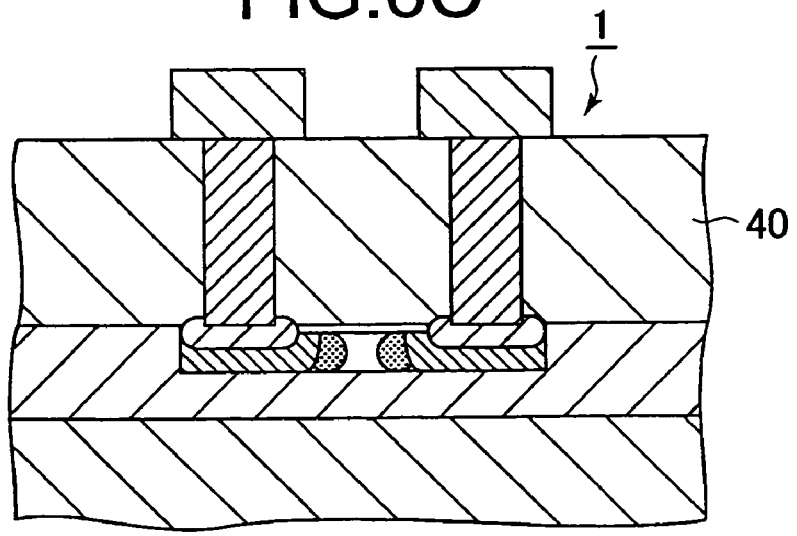

After that, as shown in FIG. 6B, silicides 30 are formed in the gate 2, the source 4 and the drain 5 self conformably. And as shown in FIG. 6C, the deposition of an interlayer dielectric 40, the formation of contact holes and metalization are performed.

In the semiconductor device 1 of the present embodiment, because the changes of threshold values can be suppressed independently from the formation of thinner SOI films 23 even when constituting transistors having short channels, the thickness of the SOI films 23 can be formed within a range of a 1/10 to 1/2 of the gate lengths, thus becoming it easy to stop the etching of the interlayer dielectric 40 at the source 4 and the drain 5, and it becomes possible to realize relieved manufacturing conditions. By these processes, the semiconductor device 1 of the present embodiment is completed.

It is to be noted that, although an N-MOS transistor is exemplified in the above-mentioned embodiment, a P-MOS transistor can also be applied. In addition, a CMOS transistor can also be manufactured by implanting ionic species separately with resist masks.

In addition, although a SIMOX substrate is used as an SOI substrate, other SOI substrates made by lamination methods such as ELTRAN, Unibond and the like can be used besides the SIMOX substrate. Furthermore, each structure of a transistor, impurity concentrations, ion implantation conditions, and the like are not limited to the above-mentioned examples.

Next, a second embodiment is described. A semiconductor device according to the second embodiment is characterized by forming a non-doped region having relatively low impurity concentration in a channel formation portion in a semiconductor device of a complete depletion type SOI transistor according to the first embodiment.

Now, if it is tried to control the threshold value of a complete depletion type SOI transistor by means of the impurity concentration of the channel formation portion, the threshold value is determined by the total amount of the introduced impurity. As a result, the following problems are produced.

(1) The total amount of the impurity is introduced into the channel formation portion in dependence of the thickness of the SOI film.

(2) The impurity concentration immediately after the implantation of the impurity changes in dependence of the thickness of the SOI film and, upon thermal treatment after that, the total amount of the impurity diffused into the embedded oxide film or deposited on an interface changes in dependence of the thickness of the SOI film.

As a result of the above-mentioned item (1), the thicker the thickness of the SOI film is, the larger the total amount of the impurity introduced into the channel formation portion becomes, even if there is no redistribution of the impurity profile after the implantation of the impurity at all. Consequently, the threshold value is set to be high.

In addition, as a result of the above-mentioned item (2), a range Rp is set in the SOI layer for making almost all of the impurity stay in the SOI active layer. In this case, the impurity concentration in the vicinity of the interface between the SOI film and the embedded oxide film becomes low when the thickness of the SOI film is thick, and becomes high when the thickness of the SOI film is small.

In this case, the impurity introduced into the SOI layer is diffused into the embedded oxide film or is deposited on the interface of the embedded oxide film. Because the diffusion or the deposition of the impurity is produced basically in proportion to the impurity concentration, the diffusion or the deposition is more notable in a thin SOI layer in which the impurity concentration in the vicinity of the interface between the SOI film and the embedded oxide film becomes high.

Figure 7C:
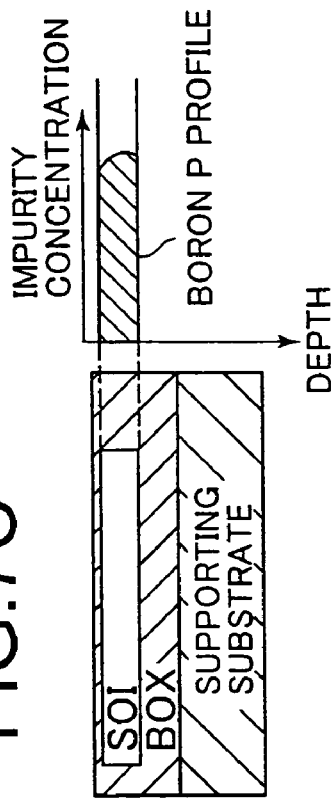
FIGS. 7A to 7D are schematic diagrams illustrating differences of impurity concentrations in accordance with thicknesses of SOI films.
Figure 7D:
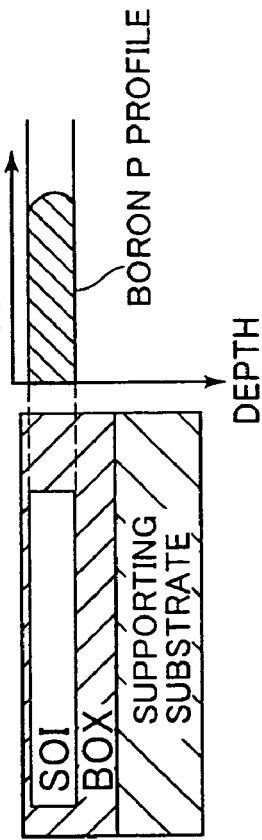
Figure 7A:
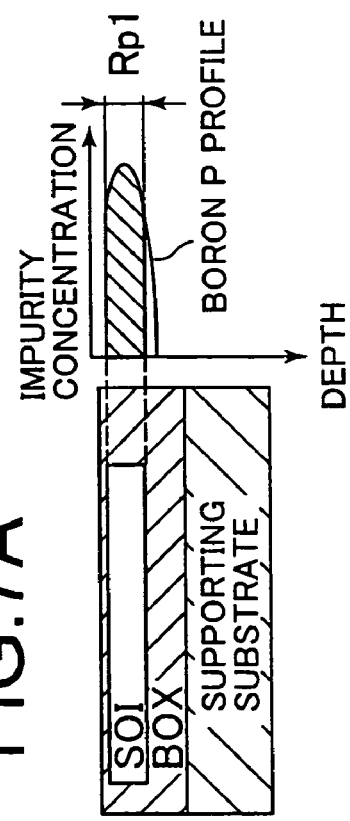
Figure 7B:
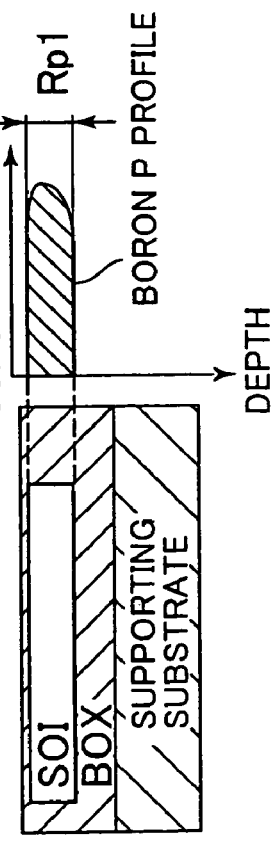

FIGS. 7A-7D are schematic diagrams illustrating differences of impurity concentrations in accordance with thicknesses of SOI films. In other words, as shown in FIG. 7A, in the case where the thickness of the SOI film is thin, part of the impurity is implanted on the outside of the SOI layer, and, as shown in FIG. 7C, the impurity diffuses to the outside of the SOI layer after thermal treatment. On the other hand, as shown in FIG. 7B, in the case where the thickness of the SOI film is thick, almost all of the impurity is implanted into the SOI layer, and, as shown in FIG. 7D, the diffusion of the impurity to the outside of the SOI layer becomes smaller after the thermal treatment.

As a result, according to the degree of the thermal treatment, the effective difference of the total amounts of the impurity increases more and more between the thin SOI layer and the thick SOI layer. In particular, because the diffusion coefficient in $SiO_2$ is larger than that in Si in the case where the impurity is boron, the finished concentration of the impurity introduced in the channel formation portion decreases in the vicinity of the interface of an embedded oxide film. In addition, it is known that phosphorus is deposited on an interface between Si and $SiO_2$ in the case where the impurity is phosphorus, so it brings about a same result as the decrease of the impurity concentration. In a worst case, the impurity concentration in the SOI film becomes constant independent of the thickness of the SOI film after a sufficient heat treatment. In this case, the finished threshold value of a transistor is simply proportional to the thickness of the SOI film in the channel formation portion.

At present time, the distribution of the thickness of a SIO film in a surface is approximately ±4.0 nm even in a relatively satisfactory case; if, for example, the thickness of the SOI film at the center of the finished channel formation portion of a complete depletion type SOI transistor having the thickness of 0.13 μm is set to be 26 nm (the upper limit of the thickness of the SOI film is determined by the short channel effect), and the threshold value at the center is set to be 0.3 V (the impurity concentration is $2\times10^{18}$ $cm^{-3}$ or less), a channel impurity concentration is comparatively high, and the thickness of the SOI film is small; consequently, the impurity concentration of a finished channel formation portion becomes almost a constant value independently from the thickness of the SOI film, and the threshold value distribution of ±46 mV is produced only by the distribution of the thickness of the SOI film in a surface.

Although it is most effective to decrease a power supply voltage for decreasing the electrical power consumption of an LSI, it is necessary to decrease the threshold value thereof for decreasing the power supply voltage without decreasing working speed. In case of the worst design, the threshold value cannot be set to be low unless the dispersion of the threshold value is made to be small. Consequently, when considering the application to a low electric power LSI, the above-mentioned increase of the distribution of the threshold values is a problem that should be solved completely.

In addition, in the case where ions of an impurity are implanted into a channel formation portion through a gate electrode after the formation of the gate electrode, it is reported (M. Racaneili, et al.; IEDM Tech. Dig., '95 pp. 885) that a narrow channel effect can be suppressed by the decrease of the thermal process after the introduction of the channel impurity. However, because the ions of the impurity are implanted into the channel formation portion through the gate electrode after the formation of the gate electrode in this case, the impurity is introduced into an active SOI layer of a thin film through the relatively thick gate electrode, and thereby the distribution ΔRp of the range of the ions becomes large.

Consequently, the total amount of the impurity introduced into the active SOI layer changes in great dependence on the thickness of the SOI film (the impurity concentration in the depth direction approaches uniquely), hence, the dependency of the threshold value on the thickness of the SOI film becomes large in the event.

From the background described above, there is a need for a complete depletion type SOI transistor having the suppressed dependency of its threshold value on the thickness of its SOI film even if the threshold value is intended to be controlled by the impurity concentration to be introduced into its channel formation portion, and also is a need for a suitable method of manufacturing of the SOI transistor.

The present embodiment is characterized by the formation of a non-doped region of an impurity at the central portion of the channel formation portion 10 in the semiconductor device 1 (see FIG. 1) composed of a complete depletion type SOI transistor according to the first embodiment from the point of view mentioned above.

In other words, the implantation of an impurity for adjusting the threshold value is not performed to the channel formation portion at least before the deposition of the gate electrode; after the formation of the gate electrode and the patterning thereof, the implantation of the impurity for the adjustment of the threshold value into the channel formation portion 10 by means of oblique ion implantation or the like from a part in the vicinity of the side walls of the gate electrode (self conformable ion implantation with an oblique angle to the gate electrode pattern: Halo Ion Implantation or Pocket Ion Implantation).

Here, by controlling the profile of the impurity concentration of the channel formation portion 10 of the complete depletion type SOI transistor particularly to be higher in the vicinity of the diffusion layer or extensions relatively and to be lower in the vicinity of the center of the channel formation portion 10, it becomes possible to suppress the decrease of the threshold value owing to the short channel effect independently from only the formation of the thickness of the SOI film to be thinner.

By performing such processes, the threshold value of a long channel transistor as shown in FIG. 2A takes a value determined by a low impurity density at which almost all of the channel formation portion 10 is occupied (0 V or less in both of an N-MOS and an P-MOS in case of a poly Si gate) (the original impurity concentration of the SOI substrate). However, the threshold value of a short channel transistor as shown in FIG. 2B takes a value determined by a relatively high impurity density in the vicinity of the diffusion layers or the extension regions 12.

Because the high impurity concentration regions determining the threshold value of the short channel transistor is performed after the formation of the gate electrode pattern, it becomes possible to suppress the redistribution of the impurity in the high impurity concentration regions by setting a condition to implant all of the impurity into the SOI layer and to set the thermal treatment after the implantation to be the required shortest time. As a result, as shown in FIG. 8, it becomes possible to suppress the dependency of the threshold value of a short channel transistor to the thickness of its SOI film.

The threshold value of a long channel transistor is set to be 0 V or less in both of a N-MOS and a P-MOS in case of a poly Si gate, and the dependency of the threshold value to the thickness of the SOI film becomes to be about zero. There are a few chances that the long channel transistor is used in an ordinary LSI. However, if the long channel transistor is used at an appropriate threshold value, it is also possible to set a suitable threshold value by connecting the long channel transistor with a short channel transistor in series.

Figure 9A:
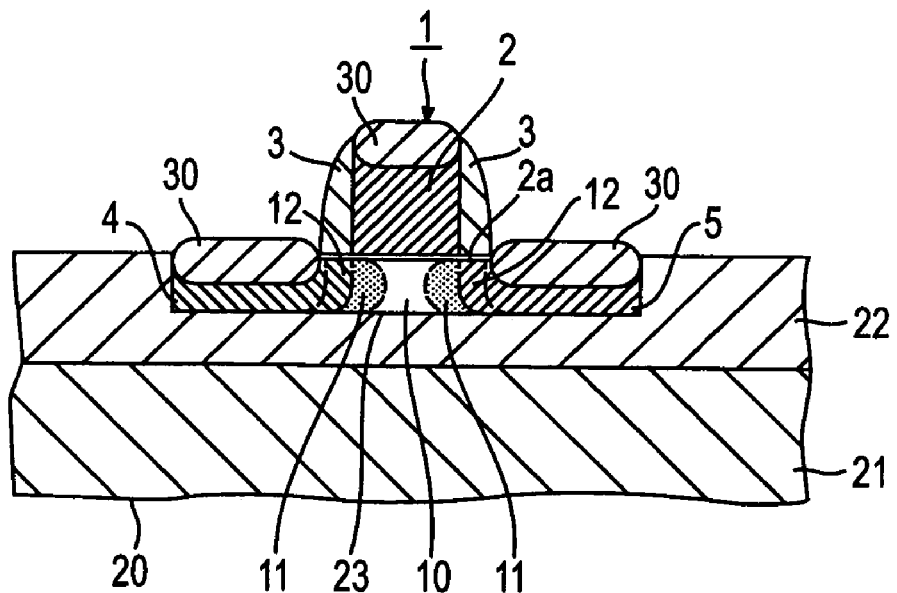
FIGS. 9A and 9B are schematic section diagrams illustrating semiconductor devices according to a second embodiment.
Figure 9B:
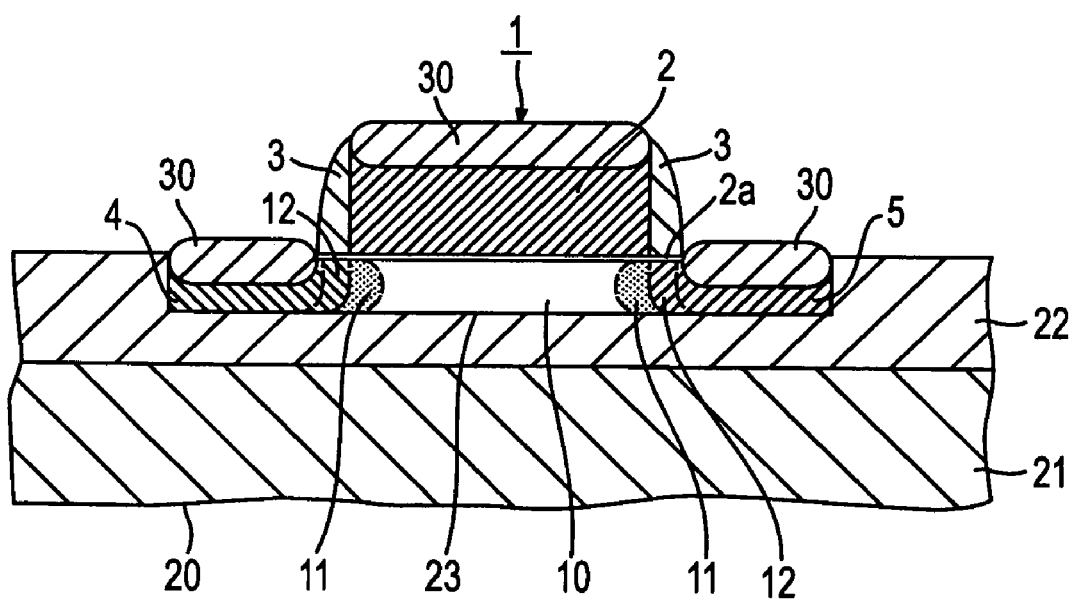

Next, a specific example of the second embodiment is described. FIGS. 9A to 9B are schematic section diagrams illustrating concrete examples of the second embodiment, in which the figures show the section diagrams of N-MOS transistors formed on SIMOX substrates. In FIGS. 9A and 9B, the N-MOS transistors are formed on, for example, a SIMOX substrate (or a low dose SIMOX) 20 composed of a p-type support substrate having a low specific resistance of 20 Ω cm or less and an embedded oxide film of 100 mn in thickness.

The thickness of an SOI layer 23 directly under a gate is, for example, 26 nm. In the diffusion layers of a source 4 and a drain 5 and the gate 2, silicides 30 are formed self conformably with, for example, Co of 5 nm in deposited film thickness (the thicknesses of $CoSi_2$ are 18 nm or less on all of the diffusion layers and the gate electrode).

The thickness of an insulation film 2a to be a gate oxide film is 3.5 nm; the gate 2 is composed of $n^+$ poly Si of 200 nm in thickness in which Phos is sufficiently doped. As is doped in all of the diffusion layers and extension regions 12 in a high concentration, and Si layers including the extension regions 12 are made to have sufficiently low resistances.

Side walls 3 formed on the side walls of the gate 2 are formed with $SiO_2$, and their widths are, for example, 100 nm or less.

Hereupon, the impurity concentration nearby the center (non-doped region) of a channel formation portion 10 directly under the gate 2 is $5 \times 10^{17}$ $cm^{-3}$ or less, which is the impurity concentration of the original SOI substrate, at least in a long channel transistor having a gate length longer than, for example, 0.5 µm.

On the other hand, in a short channel transistor having a gate length shorter than 0.5 µm, the effective impurity concentration of its channel becomes larger as the gate length reduces. For example, in case of a gate length of 0.13 µm, the impurity concentration is $2 \times 10^{18}$ $cm^{-3}$ or less.

The peak concentration of the impurity concentration in high concentration regions 11 adjacent to the extension regions 12 in the channel formation portion 10 or in the vicinity of the extension regions 12 is $3 \times 10^{19}$ $cm^{-3}$ or less (B is $1 \times 10^{14}$ $cm^{-2}$ or less by the dose). The high concentration regions 11 in the channel formation portion 10 are severally set to be formed, for example, to 50 nm or less in the lateral direction uniformly even if the gate length changes.

By employing such a structure, a threshold value Vth of an N-MOS transistor becomes 0.0 V or less in a long channel transistor having a gate length Lg of 0.5 µm or more, and the dependency of the threshold value Vth on the thickness of an SOI film is almost removed. In addition, in a short channel transistor having a gate length Lg of 0.13 µm or less, its threshold voltage Vth becomes 0.3 V or less. Because only the minimum thermal treatment is performed after an impurity is introduced by Halo Ion Implantation in this case, also, it becomes possible to sufficiently suppress the redistribution of the impurity and the dependency of the threshold value Vth on the thickness of the SOI film, which accompanies the redistribution.

It is to be noted that, an example of an N-MOS transistor is shown in the above-mentioned description, but the present invention is not limited to the various conditions and the like that are used here. In addition, any substrate on the market made by lamination methods such as ELTRAN, Unibond and the like can be used as an SOI substrate, on which an SOI transistor is formed, besides the SIMOX substrate. Furthermore, the designs of the thickness of the SOI film, each structure of a transistor, the concentration of the impurity and the profile thereof, and the like can be changed suitably. Needless to say, it is possible to apply the present invention to a P-MOS transistor quite similarly.

Next, a method of manufacturing of the semiconductor device according to the second embodiment is described. The method of manufacturing of the semiconductor device according to the second embodiment is basically the same as the method of manufacturing of the semiconductor device according to the first embodiment shown in FIGS. 4A-4C, 5A-5C and 6A-6C. The method of the second embodiment differs from the method of the first embodiment in that the ion implantation to the channel formation portion 10 shown in FIG. 4B is not performed.

In other words, the element isolation in accordance with Trench Method is performed by a well-known technique by the use of an SOI substrate such as an SIMOX (for example the thickness of its SOI film is 42 nm or less) or the like. Next, without performing the ion implantation into the channel formation portion 10 shown in FIG. 4B, a non-doped region is formed at the central portion of the channel formation portion 10.

Next, after the formation of a gate oxide film, as shown in FIG. 4C, poly Si to be the gate 2 is deposited. Then, after the introduction of an impurity (Phos) into the gate 2, the gate 2 is formed by patterning.

Next, as shown in FIG. 5A, an impurity for forming the extension regions 12 self conformably to the gate 2 is implanted into the SOI film 23. The conditions of the ion implantation are the same as those of the first embodiment.

Successively, as shown in FIG. 5B, for forming high concentration regions 11 having relatively high channel impurity concentrations than that of the central portion at end parts of the channel formation portion 10 adjoining the extension regions 12, for example, oblique ion implantation (Halo Ion Implantation or Pocket Ion Implantation) is performed under the same conditions as those of the first embodiment.

By performing the oblique ion implantation self conformable in relation to the gate 2, it becomes possible to form the high concentration regions 11 having relatively high impurity concentrations in comparison with that of the center independently from the gate length to be constant widths on end parts of the channel formation portion 10 adjacent to the extension regions 12.

Next, as shown in FIG. 5C, the side walls 3 are formed on the side walls of the gate 2 by the total surface deposition of $SiO_2$ and etch back. Next, as shown in FIG. 6A, after the ions of an impurity (for example As) is implanted into portions to be the source 4 and the drain 5 of the SOI film 23 to high concentrations, a heat treatment for the activation of the impurity is performed under, for example, the same conditions as those of the first embodiment.

After that, as shown in FIG. 6B, silicides 30 are formed in the gate 2, the source 4 and the drain 5 self conformably and as shown in FIG. 6C, the deposition of an interlayer dielectric 40, the formation of contact holes and metallization are performed.

By such a semiconductor device according to the second embodiment, it becomes possible to suppress the dependency of a threshold value on the thickness of the SOI film in a complete depletion type SOI transistor even though the threshold value is controlled by means of the impurity concentration of the channel formation portion. As a result, the dependency of the threshold value to the thickness of the SOI film is eased so as to make it possible to increase the uniformity of the threshold value and to improve the characteristics of making the electrical power consumption lower (electrical power consumption lowering characteristics).

It is to be noted that the contents described above are only an example of the present invention, and the present invention is not restricted to the value of each of such process conditions. In addition, any substrate on the market made by lamination methods such as ELTRAN, Unibond and the like can be used as an SOI substrate besides the SIMOX substrate. Furthermore, although a method of manufacturing of an N-MOS transistor is described here, it is possible to manufacture a P-MOS transistor quite similarly. Besides, a C-MOS transistor can be manufactured by implanting ion species separately by means of resist masks.

Figure 10A:
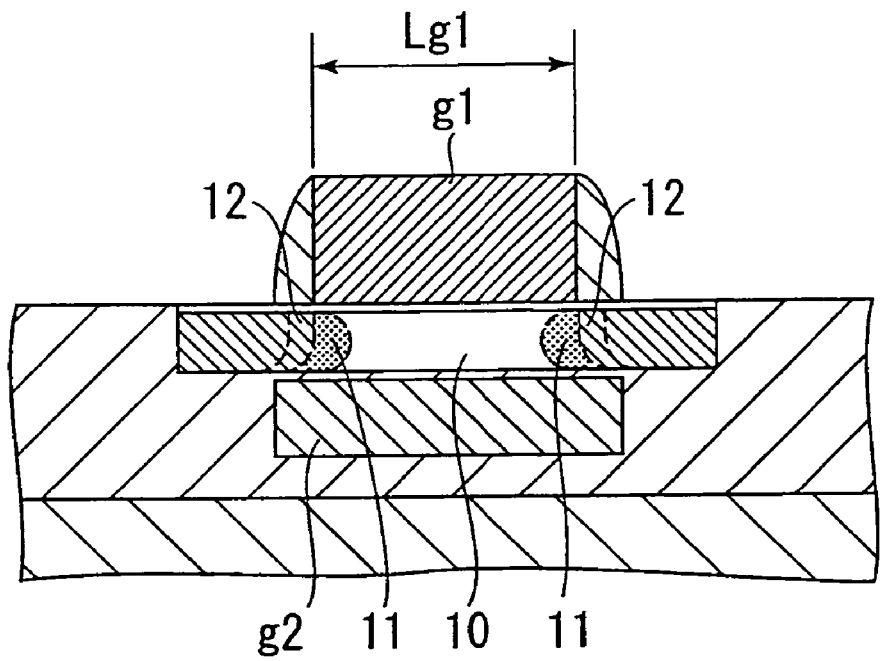
FIGS. 10A and 10B are schematic section diagrams illustrating semiconductor devices according to a third embodiment.
Figure 10B:
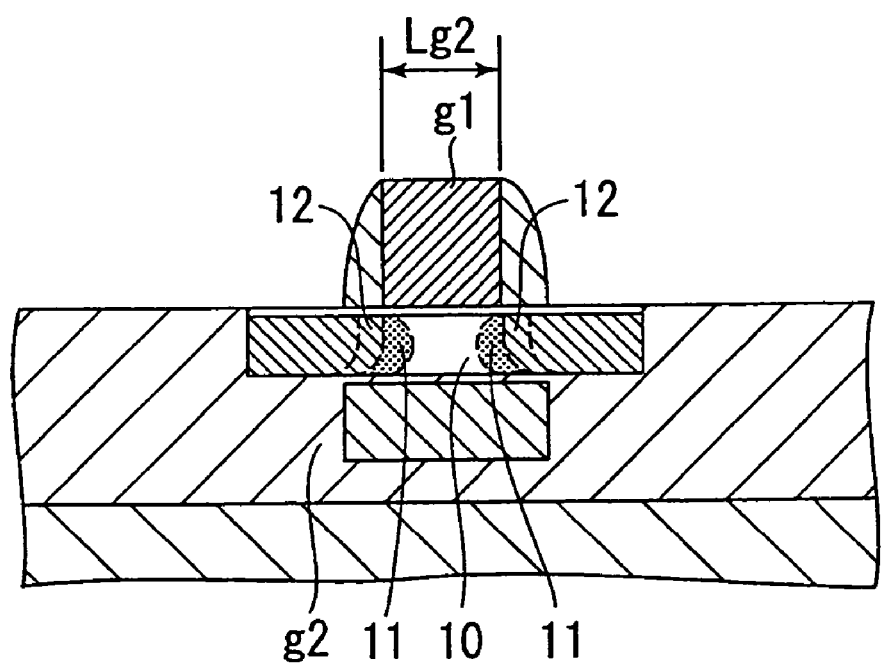

Next, a third embodiment is described. FIGS. 10A to 10B are schematic section diagrams illustrating semiconductor devices according to the third embodiment. The semiconductor device according to the third embodiment is a double gate type SOI transistor (having a structure in which a surface gate g1 and a back surface gate g2 are formed with a channel formation portion 10 between them). And the semiconductor device is made by controlling the profile of the impurity concentration in the channel formation portion 10 to be relatively high in the vicinity of a source 4 and a drain 5, or extension regions 12, and to be relatively low in the vicinity of the central portion of the channel formation portion 10 (refer to high concentration regions 11).

By structuring the semiconductor device in such a way, in a long channel transistor shown in FIG. 10A, its threshold value becomes a value determined by a low impurity concentration at which almost the entire channel formation region 10 is occupied. In a short channel transistor shown in FIG. 10B, its threshold value is determined to a value determined by the impurity concentrations in the high concentration regions 11, being relatively high, in the vicinity of the diffusion layers such as the source 4 and the drain 5 or the extension regions 12.

In particular, by setting the high concentration regions 11 to be formed to constant region widths independent from the channel length of a transistor, it becomes possible to suppress the changes of the threshold value (the shorter the channel length is, the smaller the threshold value) accompanying the changes of the channel length. This is because the contribution of the high impurity concentration becomes higher relatively as the channel length of a transistor becomes shorter to heighten the effective impurity concentration of the channel formation portion 10.

For forming the high concentration regions 11 having relatively high impurity concentrations in the channel formation portion 10 in the vicinity of the diffusion layers such as the source 4 and the drain 5 or the extension regions 12, it is sufficient to perform ion implantation into parts of at least one of the gate electrodes of a double gate type SOI transistor self conformably to the gate electrode pattern after working the gate electrode. In order to widen the high concentration regions 11 relatively especially, it is sufficient to perform oblique ion implantation (Halo Ion Implantation or Pocket Ion Implantation) self conformably to the gate electrode pattern, and to diffuse the impurity in the lateral direction (to the central direction of the channel) by a thermal treatment after that as the occasion demands.

Because it is also possible to raise the effective impurity concentration in the channel formation portion 10 according to the reduction of the channel length by adjusting the high concentration regions 11, in which the impurity concentrations are relatively high, in the vicinity of the diffusion layers such as the source 4 and the drain 5 or the extension regions 12, and by adjusting the widths of the high concentration regions 11, it becomes also possible to correct a roll-off characteristic in which the threshold value increases according to the reduction of the channel length.

Figure 11:
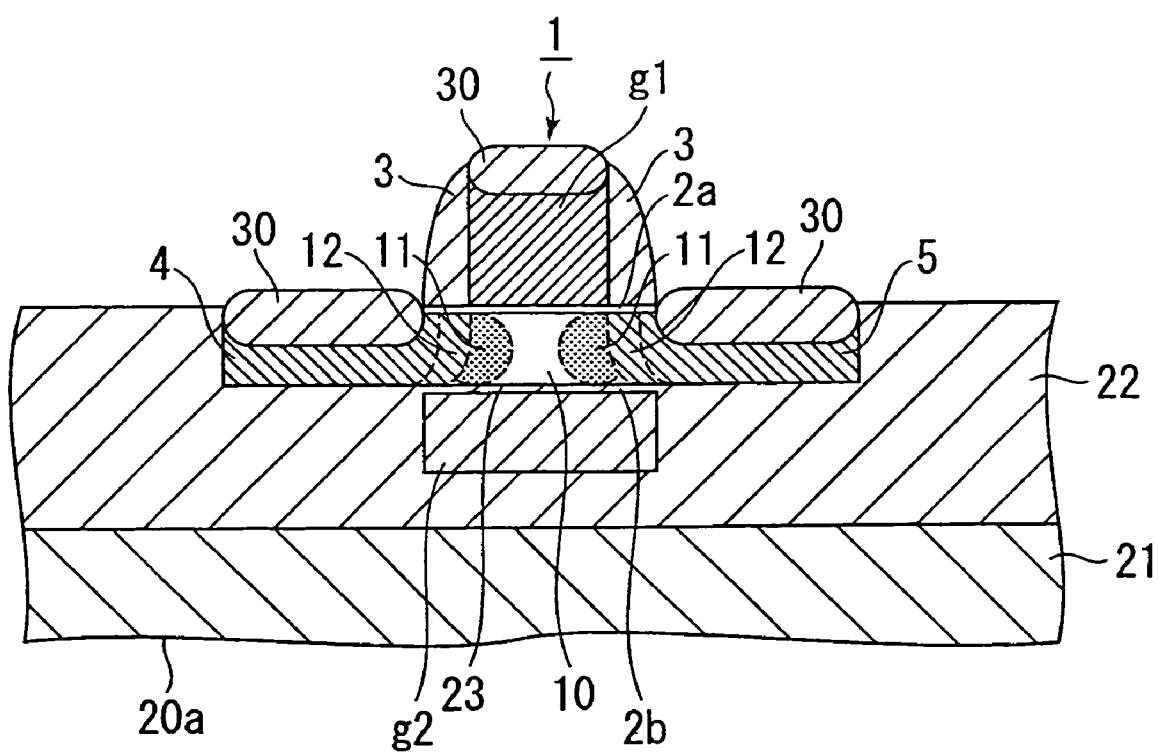
FIG. 11 is a schematic section diagram illustrating a concrete example of a semiconductor device according to the third embodiment.

Next, a concrete example of a semiconductor device according to the third embodiment is described. FIG. 11 is a schematic section diagram illustrating a specific example of the semiconductor device according to the third embodiment. The semiconductor device 1 shown in FIG. 11 is an N-MOS transistor formed on a laminated SOI substrate 20a including an embedded back surface gate g2 in the substrate.

In FIG. 11, the N-MOS transistor is formed on the laminated SOI substrate 20a composed of, for example, a p-type support substrate 21 having a specific resistance of 20 Ω cm or less and an embedded oxide film of, for example, 600 nm in thickness. The back surface gate g2 is $p^+$ poly Si of about 150 nm in thickness, in which, for example, boron is sufficiently doped. In addition, the thickness of an insulation film 2b being a back surface insulation film is 30 nm, and the thickness of a SOI film 23 directly under a surface gate g1 is, for example, 40 nm. In diffusion layers such as a source 4 and a drain 5 and the surface gate g1, silicides 30 are formed self conformably with, for example, Co of 8 nm in deposited thickness (the thicknesses of $CoSi_2$ are 29 nm or less on all of the diffusion layers and the gate electrode).

The thickness of an insulation film $2a$ being the surface gate oxide film is 1.8 nm. The surface gate $g1$ is composed of $n^+$ poly Si of 150 nm in thickness in which Phos is sufficiently doped.

As is doped in all of the diffusion layers such as the source 4 and the drain 5 and extension regions 12 in a high concentration, and Si layers including the extension regions 12 are made to have sufficiently low resistances.

Side walls 3 formed on the side walls of the surface gate $g1$ are formed with $SiO_2$, and their widths are, for example, 100 nm or less.

Hereupon, although the impurity concentration nearby the center of the channel formation portion 10 directly under the surface gate $g1$ is $1.5 \times 10^{18}$ $cm^{-3}$ or less (B is $6 \times 10^{12}$ $cm^{-2}$ by the dose), the peak concentration of the impurity concentration in the high concentration regions 11 adjacent to the extension regions 12 in the channel formation portion 10 or in the vicinity of the extension regions 12 is $2.5 \times 10^{19}$ $cm^{-3}$ or less (B is $1 \times 10^{14}$ $cm^{-2}$ or less by the dose).

The high concentration regions 11 having the impurity concentrations being relatively high in the channel formation region 10 are severally set to be formed, for example, to be 50 nm or less in the lateral direction uniformly even if the gate length changes.

It is to be noted that an example of an N-MOS transistor is shown in the present embodiment, but the present invention is not limited to the various conditions and the like that are used here. In addition, the designs of the thickness of the SOI film, each structure of a transistor, the concentration of the impurity and the profile thereof, and the like can be changed suitably. Needless to say, it is possible to apply the present invention to a P-MOS transistor quite similarly.

Next, a method of manufacturing of the semiconductor device according to the third embodiment is described. FIGS. 12A-12C, 13A-13C and 14A-14C are diagrams illustrating the method of manufacturing of the semiconductor device according to the present embodiment. At first, a back surface gate $g2$ is formed in the inside of a substrate while a laminated SOI substrate $20a$ is made, by a well-known technique disclosed in IEDM '91 pp. 683 (Tetsu Tanaka, et al.) or Japanese Patent Laid-Open Publication No. Hei 10-125881. In the case where the SOI substrate is worked by these techniques, after selection grinding using a stopper, the SOI substrate is in the state in which an active region of a MOS FET is patterned (element isolation) (see FIG. 12A).

Now, the back surface gate $g2$ is composed of $p^+$ poly Si of 150 nm in which, for example, $B^+$ is sufficiently doped. The thickness of an insulation film $2b$ being a back surface gate oxide film is, for example, 30 nm.

Figure 12A:
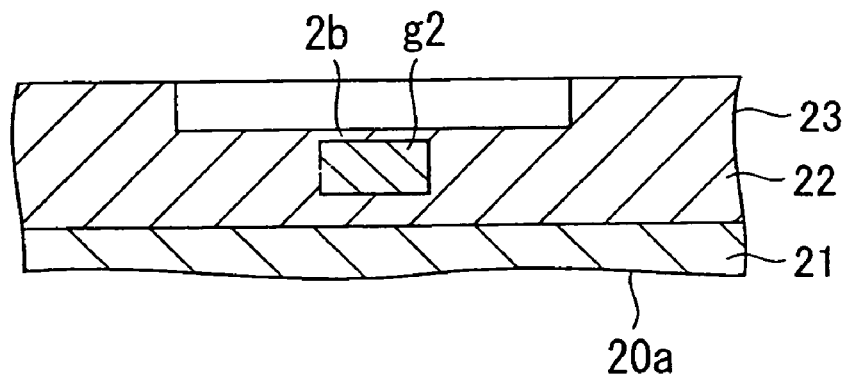
FIGS. 12A to 12C are schematic section diagrams (a first type) illustrating a method of manufacturing of a semiconductor device according to the third embodiment.
Figure 12B:
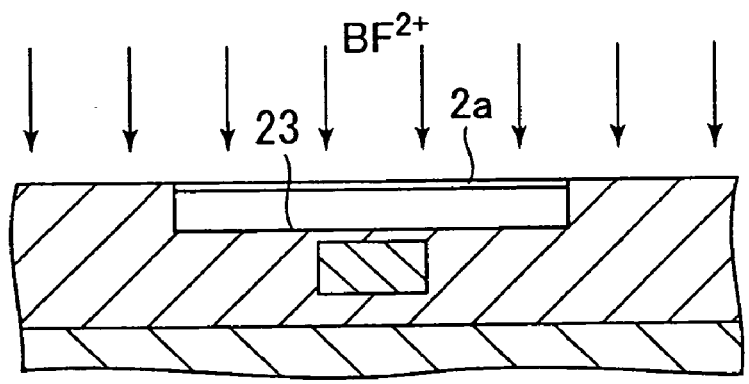

Next, as shown in FIG. 12B, after $SiO_2$ is grown on the surface of an SIO film 23 to be thin, impurity ions are implanted into a region to be a channel formation portion 10 under, for example, the following conditions.

Ionic Species: $BF_2^+$
Acceleration Voltage: 15 keV
Dose Amount: $6 \times 10^{12}$ $cm^{-2}$
Implantation Angle: 0°

By the ion implantation, the channel formation portion 10 is in a state in which the impurity is uniformly doped in the gate length direction.

Figure 12C:
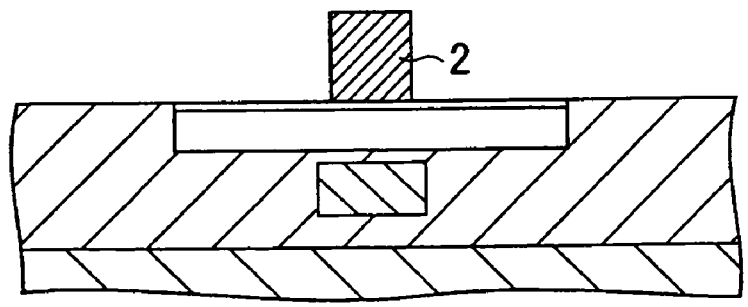

Next, after an insulation film $2a$ to be a surface gate oxide film is formed, poly Si to be a surface gate $g1$ shown in FIG. 12C is deposited. After an impurity (Phos) is introduced into the surface gate $g1$, the patterning thereof is performed.

Figure 13A:
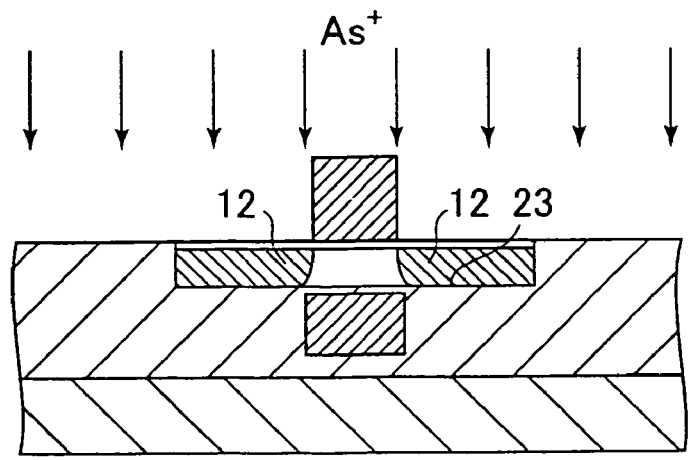
FIGS. 13A to 13C are schematic section diagrams (a second type) illustrating the method of manufacturing of the semiconductor device according to the third embodiment.

Next, as shown in FIG. 13A, ions of an impurity for forming extension regions 12 self conformable in relation to the surface gate $g1$ are implanted. The conditions of the ion implantation at this time are, for example, as follows.

Ionic Species: $As^+$
Acceleration Voltage: 2.5 keV
Dose Amount: $2.4 \times 10^{15}$ $cm^{-2}$
Implantation Angle: 0°

Figure 13B:
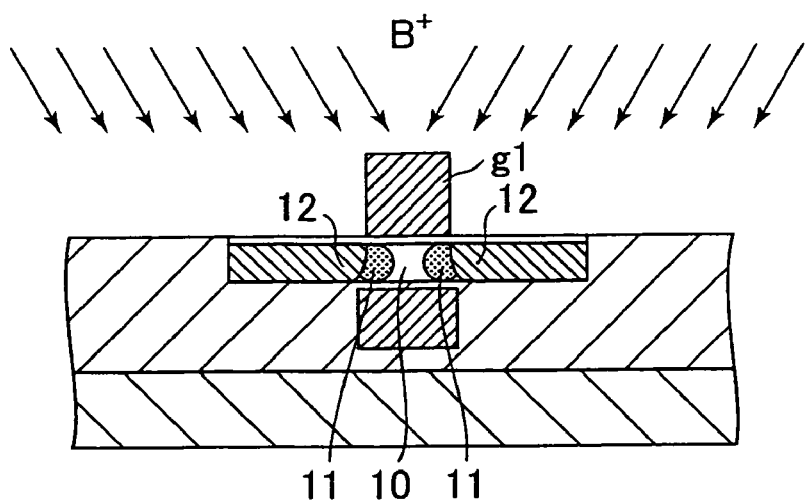

Next, as shown in FIG. 13B, oblique ion implantation (Halo Ion Implantation or Pocket Ion Implantation) is performed under, for example, the following conditions for forming high concentration regions 11, in which channel impurity concentrations are relatively higher than that at the central portion, on the end parts of the channel formation portion 10 adjacent to extension regions 12.

Ionic Species: $B^+$
Acceleration Voltage: 8.0 keV
Implantation Angle: 20°
Dose Amount: $1.0 \times 10^{14}$ $cm^{-2}$ (division implantation from eight directions of $1.25 \times 10^{13} \times 8$ per direction)

By performing the oblique implantation self conformably to the surface gate $g1$ in the above-mentioned way, it becomes possible to form the regions, in which the impurity concentrations are relatively higher, in the channel formation portion 10 adjacently to the extension regions 12 in constant widths independently from the gate length.

Figure 13C:
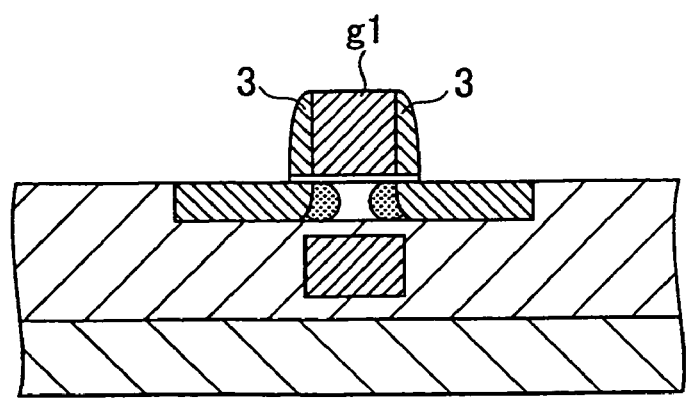
Figure 14A:
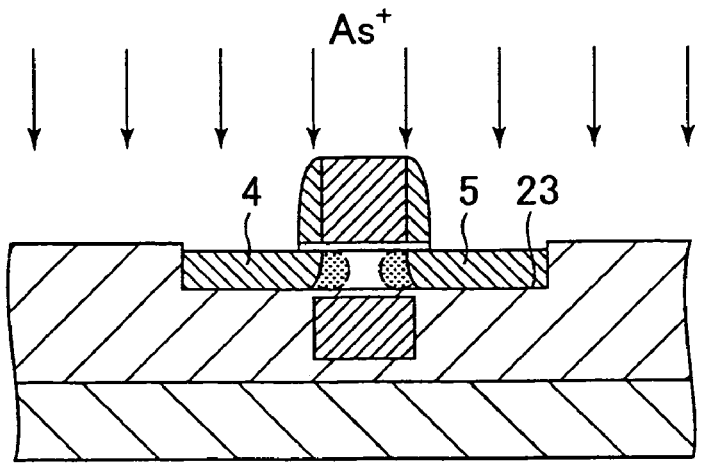
FIGS. 14A to 14C are schematic section diagrams (a third type) illustrating the method of manufacturing of the semiconductor device according to the third embodiment.

Next, as shown in FIG. 13C, side walls 3 are formed on the side walls of the surface gate $g1$ by the all surface deposition of $SiO_2$ and etch back. Next, as shown in FIG. 14A, after ions of an impurity (for example As) are implanted into diffusion layers to be a source 4 and a drain 5 to high concentrations, a heat treatment for the activation of the impurity is performed under, for example, the following conditions.

950° C., 10 sec., $N_2$ atmosphere, RTA processing

Figure 14B:
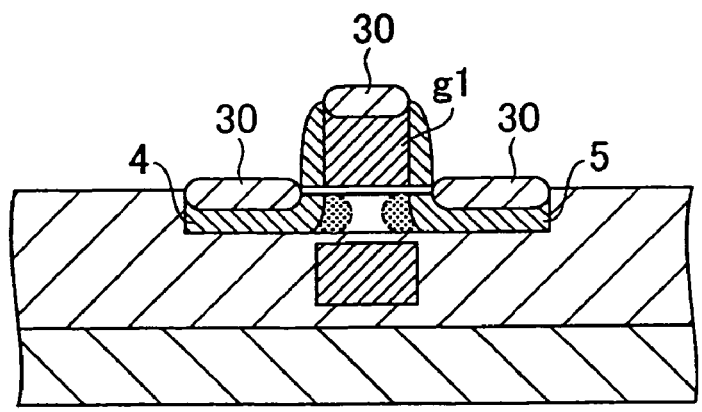
Figure 14C:
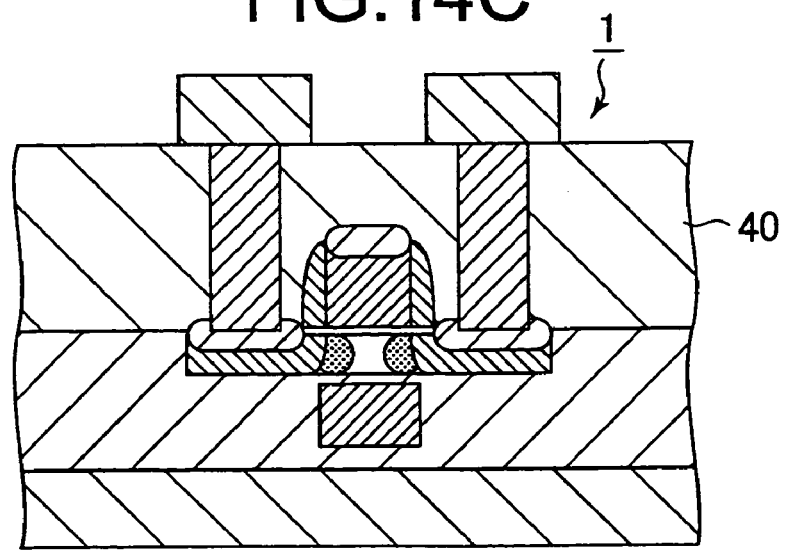

After that, as shown in FIG. 14B, silicides 30 are formed in the surface gate $g1$, the source 4 and the drain 5 self conformably. And as shown in FIG. 14C, the deposition of an interlayer dielectric 40, the formation of contact holes and metalization are performed.

By such a double gate type SOI transistor, it becomes possible to suppress the roll-off of a threshold value owing to the short channel effect without depending on only the formation of the SOI film to be thinner. As a result, even in a fine device of 0.1 μm or less, it becomes possible to suppress the roll-off of its threshold value at the thickness of the SOI film of about 20-50 nm.

In the above, a method of manufacturing of a semiconductor device according to the third embodiment is described. However, the contents described above are only an example of the present invention, and the present invention is not restricted to the value of each of such process conditions. In addition, although a method of manufacturing of an N-MOS transistor is described in the present embodiment, a P-MOS transistor can also be manufactured quite similarly. Furthermore, a CMOS transistor can also be manufactured by implanting ionic species separately with resist masks.

As described above, the following advantages can be obtained by the present invention. In other words, it becomes possible to suppress the roll-off of a threshold value Vth owing to the short channel effect of a complete depletion type SOI transistor without depending on the formation of a channel formation portion (or an SOI film) to be thinner. Because it is thereby needless to make an SOI film thin extremely even in case of forming a short channel transistor, the following becomes possible: suppressing the increase of a parasitic resistance, suppressing the decrease of the mobility of carries, and making it easier the formation of contacts in diffusion layers (a source, a drain). In addition, it becomes possible to supply a highly reliable complete depletion type SOI transistor the threshold value of which does not depend on the changes of the thickness of an SOI film.

The invention claimed is:

1. A method of manufacturing a semiconductor device comprising:

forming a gate oxide film in an SOI layer element formation region;

forming a gate on the gate oxide film;

forming at least one sidewall spacer on a side of the gate;

forming a channel formation portion having a first impurity concentration;

forming an extension region in the channel formation portion having a second impurity concentration; and performing ion implantation at a predetermined angle relative to a central axis of the gate from multiple directions to form a high concentration region that is disposed substantially beneath the gate between the extension region and a central portion of the channel formation portion, the high concentration region having an impurity concentration higher than that of the central portion of the channel formation portion, and the high concentration region having a width that is substantially constant independent of a length of the gate, the high concentration region width and gate length being along the same direction; and forming another gate in a substrate, on an opposite side to said gate, with said SOI layer interposed.

2. The method of manufacturing a semiconductor device according to claim 1, further including forming a source and a drain by implanting an impurity into a portion of the semiconductor device other than said channel formation portion.

3. The method of manufacturing a semiconductor device according to claim 2, further including forming a respective silicide region on the gate, the source, and the drain.

4. The method of manufacturing a semiconductor device according to claim 1, wherein the semiconductor device is a complete depletion type SOI transistor structure.

* * * * *